US012648090B2

(12) United States Patent
Nelson

(10) Patent No.:  US 12,648,090 B2
(45) Date of Patent:  Jun. 2, 2026

(54) POWER SYSTEMS HAVING BAFFLES WITH IMPROVED ACCESSIBILITY

(71) Applicant: Illinois Tool Works Inc., Glenview, IL (US)

(72) Inventor: Jonathon James Nelson, Menasha, WI (US)

(73) Assignee: Illinois Tool Works Inc., Glenview, IL (US)

( * ) Notice: Subject to any disclaimer, the term of this patent is extended or adjusted under 35 U.S.C. 154(b) by 617 days.

(21) Appl. No.: 17/866,313

(22) Filed: Jul. 15, 2022

(65) Prior Publication Data

US 2024/0023254 A1      Jan. 18, 2024

(51) Int. Cl.
*H05K 5/02*            (2006.01)

(52) U.S. Cl.
CPC ......... *H05K 5/0213* (2013.01); *H05K 5/0217* (2013.01)

(58) Field of Classification Search
CPC ...... H05K 5/0213; H05K 5/0217; B23K 9/32; B23K 9/1006; F02B 63/044; F02B 77/13
USPC .................. 181/202, 224, 264, 287; 60/725; D13/112
See application file for complete search history.

(56) References Cited

U.S. PATENT DOCUMENTS

| | | | | |
|---|---|---|---|---|
| 4,835,405 A | * | 5/1989 | Clancey | F02B 63/04 |
| | | | | 290/1 A |
| 5,398,161 A | * | 3/1995 | Roy | H05K 7/20545 |
| | | | | 361/752 |
| 7,642,665 B2 | * | 1/2010 | Konop | F02B 63/047 |
| | | | | 290/22 |
| 7,743,739 B2 | * | 6/2010 | Kochi | F02B 63/04 |
| | | | | 290/1 A |
| 8,525,359 B2 | * | 9/2013 | Nishimura | F02B 63/04 |
| | | | | 290/1 A |
| 8,872,361 B2 | * | 10/2014 | Janscha | F01N 13/08 |
| | | | | 290/1 A |

(Continued)

FOREIGN PATENT DOCUMENTS

| | | | | | |
|---|---|---|---|---|---|
| JP | | 3778429 B2 | * | 5/2006 | F02B 63/04 |
| WO | WO-2010060482 A1 | | * | 6/2010 | F02B 63/04 |
| WO | WO-2010066106 A1 | | * | 6/2010 | F02B 63/04 |

OTHER PUBLICATIONS

Machine translation of WO2010066106A1 (Year: 2010).*
Machine translation of JP-3778429-B2 (Year: 2006).*

*Primary Examiner* — Forrest M Phillips
*Assistant Examiner* — Jennifer B Olson
(74) *Attorney, Agent, or Firm* — McAndrews, Held & Malloy, Ltd.

(57) ABSTRACT

Example power systems include: an enclosure having a base and an upper portion above the base, and the enclosure having at least a first volume and a second volume within the enclosure; an engine within the second volume of the enclosure; a generator within the second volume of the enclosure and configured to convert mechanical power from the engine to electrical power; and a baffle located within the enclosure and between the first volume and the second volume of the enclosure, the baffle configured to direct airflow between the first volume and the second volume through an aperture, and the baffle being attached to the enclosure above the base such that the baffle is removable from the enclosure and installable into the enclosure via access to the baffle via the upper portion of the enclosure.

17 Claims, 9 Drawing Sheets

(56) References Cited

U.S. PATENT DOCUMENTS

|  |  |  |  |  |
|---|---|---|---|---|
| 8,881,694 | B2 * | 11/2014 | Gillett | F01P 7/16 |
|  |  |  |  | 123/41.1 |
| 9,997,977 | B1 * | 6/2018 | Roll | H02K 7/1815 |
| 10,132,224 | B2 * | 11/2018 | Jenison | F01N 13/1855 |
| 10,744,586 | B2 * | 8/2020 | Hruska | B23K 37/003 |
| 2021/0017902 | A1 * | 1/2021 | Enyedy | F02B 63/04 |

* cited by examiner

POWER SYSTEMS HAVING BAFFLES WITH IMPROVED ACCESSIBILITY

FIELD OF THE DISCLOSURE

This disclosure relates generally to power systems and, more particularly, to power systems having baffles with improved accessibility.

BACKGROUND

Conventionally, engine-driven power systems (e.g., generators/air compressors/welders) are contained within a metal enclosure that provides environmental protection for the equipment and provides a safety, sound, and aesthetic barrier for the operators. Engines may further include a fan to generate airflow for combustion and cooling purposes.

SUMMARY

Power systems having baffles with improved accessibility are disclosed, substantially as illustrated by and described in connection with at least one of the figures, as set forth more completely in the claims.

BRIEF DESCRIPTION OF THE DRAWINGS

The figures are not necessarily to scale. Where appropriate, similar or identical reference numbers are used to refer to similar or identical components.

DETAILED DESCRIPTION

Figure 1:
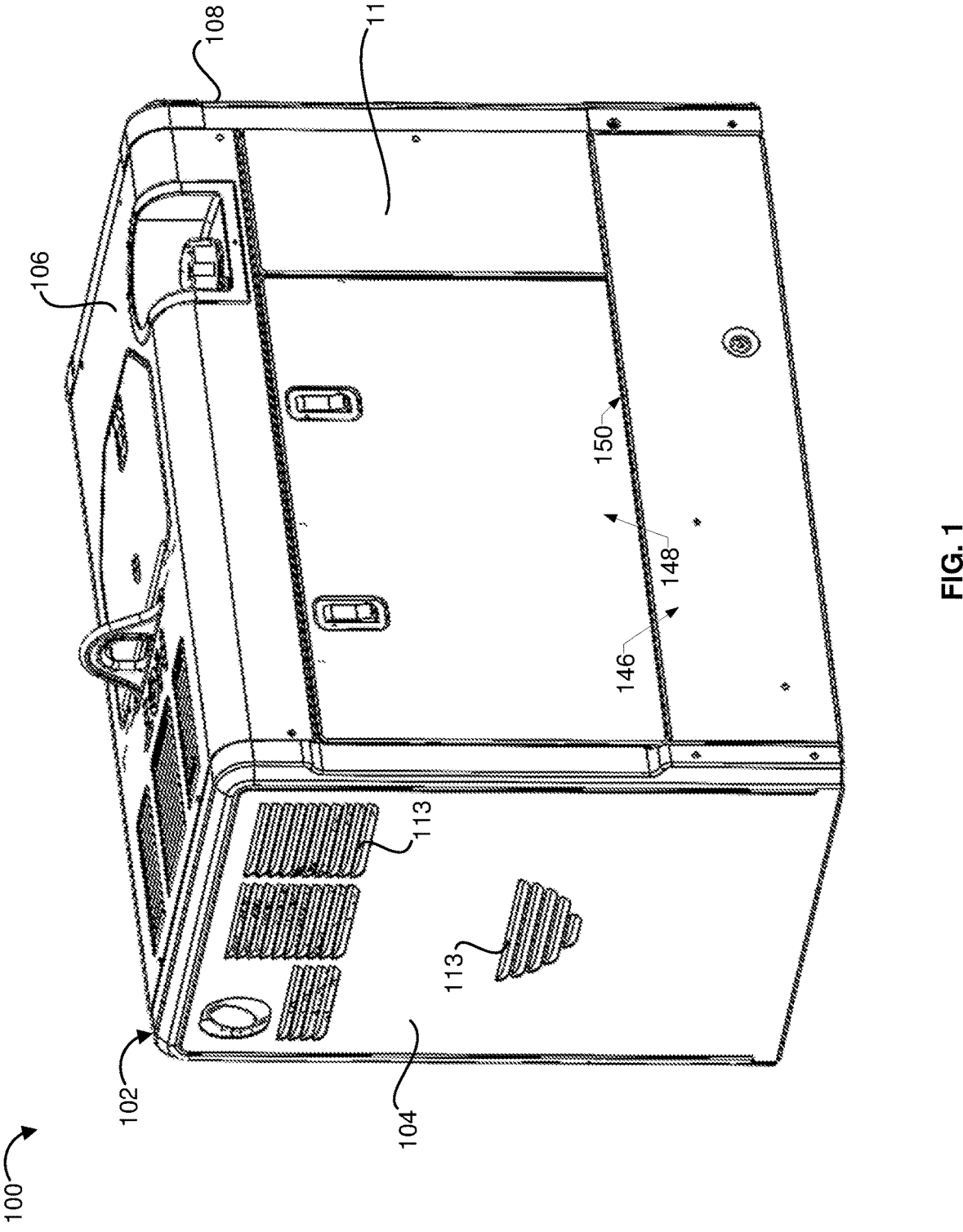
FIG. 1 is a perspective view of an example power system, in accordance with aspects of the present disclosure.

Conventional power systems include airflow-controlling structures, such as baffles, to control airflow within the power system. Conventional engine baffles, which help direct air into an engine fan or intake, are installed using several bolts around the perimeter of the baffle, including at the bottom of the system. Conventional baffles are designed for particular installations, such as through a specific opening of the product. Due to their size and/or cross-sections, conventional baffles are often installed early in the assembly process of the system. When service is required on certain components of the system, conventional baffle designs may prevent removal components and/or inhibit or restrict access to components. As a result, labor-intensive removal of the baffle may be required to perform certain maintenance, and/or service technicians may be required to work in a very small area to service certain components in the system.

Disclosed example power systems include a baffle that allows installation and removal in two or more directions. In some examples, the baffle can be installed, or removed, from the top of the system downwards, and through the front of the enclosure. As a result, disclosed example power systems and baffles allow the baffle to be installed at much later in the assembly process, which may improve the assembly process for other components as well. In disclosed examples, the baffle is installed by attachment at more accessible locations than conventional systems, such as by omitting mounting hardware at the bottom of the baffle.

Disclosed example power systems allow service technicians to remove the baffle without major disassembly of electrical systems in the front of the machine, which can substantially reduce the required service time involved in removing the baffle. In some examples, the installation and mounting of the baffle also allows easy removal when additional space is required for service, such as when servicing electrical components in the front of the system.

Welding-type power, as used herein, refers to power suitable for welding, plasma cutting, induction heating, electrode preheating, CAC-A and/or hot wire welding/preheating (including laser welding and laser cladding).

As used herein, the terms "power system," "service pack" and "auxiliary power unit" refer to an engine driven power source which may be auxiliary or supplemental to a primary power source such as a vehicle engine.

Disclosed example power systems include: an enclosure comprising a base and an upper portion above the base, and the enclosure having at least a first volume and a second volume within the enclosure; an engine within the second volume of the enclosure; a generator within the second volume of the enclosure and configured to convert mechanical power from the engine to electrical power; and a baffle located within the enclosure and between the first volume and the second volume of the enclosure, in which the baffle is configured to direct airflow between the first volume and the second volume through an aperture, and in which the baffle is attached to the enclosure above the base such that the baffle is removable from the enclosure and installable into the enclosure via access to the baffle via the upper portion of the enclosure.

In some example power systems, the enclosure further includes a support rail positioned between the base and the upper portion. In some example power systems, the baffle is configured to be attached to the enclosure via the support rail. In some example power systems, the baffle is not attached to the enclosure below the support rail.

In some example power systems, the enclosure includes a front panel located on a front of the enclosure, in which the front panel has at least one of a user interface or a welding output terminal, and the baffle is removable through the front of the enclosure when the front panel has been removed. In some example power systems, the baffle is removable through a top of the enclosure. In some example power systems, the enclosure includes a top panel, and the baffle is removable through the top panel. In some example power systems, the baffle is removable through the top panel without requiring removal of other components.

In some example power systems, the baffle includes a removable upper portion having at least a portion of the aperture and a lower portion, wherein the lower portion remains in the base when the upper portion is removed. In some example power systems, the baffle is a single molded or formed piece. In some example power systems, the aperture aligns with an intake fan of the engine. In some example power systems, the baffle is adjacent the engine.

Some example power systems further include, within the enclosure, one or more of: welding-type conversion circuitry configured to convert the electrical power from the generator to welding-type power; an air compressor coupled to at least one of the electrical power from the generator or the mechanical power from the engine and configured to output compressed air; a hydraulic pump configured to generate hydraulic pressure from at least one of the electrical power from the generator or the mechanical power from the engine; or auxiliary power conversion circuitry configured to convert the electrical power from the generator to at least one of AC output power or DC output power. In some example power systems, the base is configured to support one or more of the engine, the generator, the welding-type conversion circuitry, the air compressor, the hydraulic pump, or the auxiliary power conversion circuitry.

In some example power systems, the baffle includes protrusions to be attached to the enclosure via inserting the protrusions into holes in the enclosure.

FIG. 1 is a perspective view of an example power system 100. The power system 100 may be used for various applications, such as, for example, providing compressed air, generating power, pumping, and/or welding support. As illustrated in FIG. 1, the power system 100 includes the enclosure 102. The enclosure 102 protects internal components of the power system 100 from the environment, as well as providing a safety, sound, and aesthetic barrier for an operator using or within range of the power system 100. The enclosure 102 is primarily constructed with sheet metal, and may include multiple panels. For example, the enclosure 102 may include the rear panel 104, a top panel 106, a front panel 108, and side panels 110 when installed in a predetermined orientation (e.g., when the power system 100 is installed in accordance with the power system's 100 intended use). In some cases, one or more of the rear panel 104, the top panel 106, the front panel 108, and the side panels 110 may each include multiple panels. One or more of the panels may be removable and/or one or more of the panels may open, to permit access. In some examples, one or more of the rear panel 104, the top panel 106, the front panel 108, or the side panels 110 may define additional features. For example, the rear panel 104 may define louvers 113 to permit airflow into or out of the enclosure 102. Any of the rear panel 104, the top panel 106, the front panel 108, or the side panels 110 may include additional or alternative features.

Figure 2:
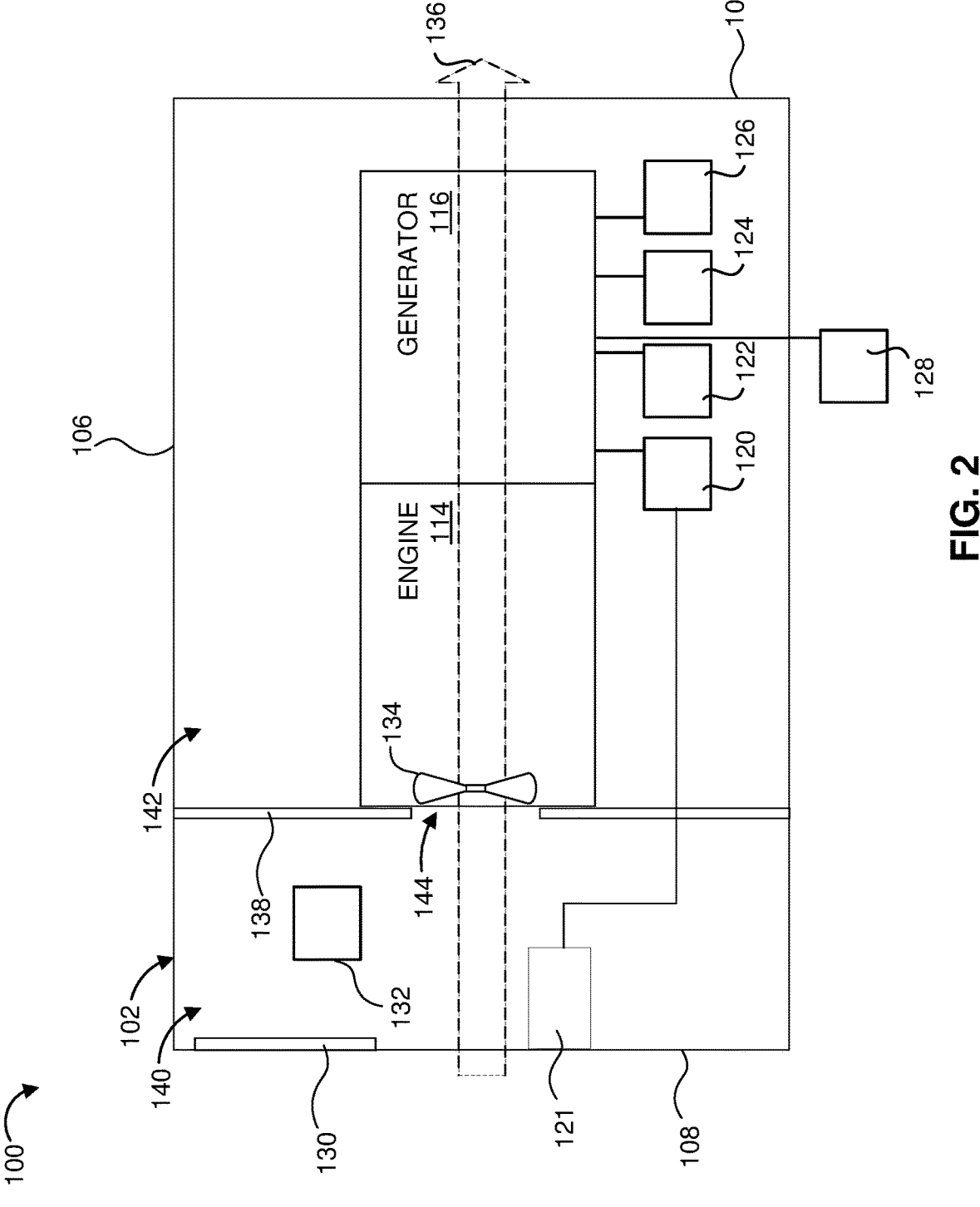
FIG. 2 is a block diagram of the example power system including the enclosure of FIG. 1.

FIG. 2 is a block diagram of the example power system 100 including the enclosure 102 of FIG. 1. The example power system 100 may include other components not specifically discussed herein, or may omit one or more of the components discussed herein. The components of the power system 100 may be arranged within the enclosure 102 in any suitable configuration.

The example power system 100 of FIG. 2 is an engine-driven power system. The system 100 includes an engine 114 that drives a generator 116 to generate electrical power. The engine 114 may be an internal combustion engine, a diesel engine, a fuel cell, etc. The engine 114 is configured to output mechanical power to drive the generator 116. In some examples, the engine 114 is forward (e.g., toward the front panel 108 within the enclosure 102) of the generator 116. The engine 114 receives fuel from a fuel tank.

In some examples, the power system 100 includes one or more power subsystems. For example, the generator 116 may provide the electrical power to welding-type conversion circuitry 120 configured to output welding-type power to welding output terminals 121, an air compressor 122 configured to output pneumatic power, a hydraulic pump 124 configured to output hydraulic flow, auxiliary power conversion circuitry 126 configured to output AC power and/or DC power (e.g., DC and/or AC electrical output(s)), and/or any other load device. The example hydraulic pump 124 and the air compressor 122 may be powered by mechanical power from the engine 114 and/or by electrical power from the generator 116.

In some examples, an external power supply subsystem 128 may be coupled (e.g., plugged in, hardwired, etc.) to the power system 100 to convert at least one of the AC power or the DC power from the auxiliary power conversion circuitry 126 and/or the generator 116 to at least one of AC power or DC power, such as to power external devices that have different power requirements. The example external power supply subsystem 128 may also be communicatively coupled to control circuitry 132 of the power system 100 (e.g., wirelessly, via power line communication, via a communication cable, etc.) to enable the control circuitry 132 to control the demand and/or output of the external power supply subsystem 128.

The welding-type conversion circuitry 120 converts output power from the generator 116 (e.g., via the intermediate voltage bus) to welding-type power based on a commanded welding-type output. The welding-type conversion circuitry 120 provides current at a desired voltage to an electrode and a workpiece via output terminals to perform a welding-type operation. The welding-type conversion circuitry 120 may include, for example, a switched mode power supply or an inverter fed from an intermediate voltage bus. The welding-type conversion circuitry 120 may include a direct connection from a power circuit to the output (such as to the weld studs), and/or an indirect connection through power processing circuitry such as filters, converters, transformers, rectifiers, etc.

The auxiliary power conversion circuitry 126 converts output power from the generator 116 (e.g., via the intermediate voltage bus) to AC power (e.g., 120 VAC, 240 VAC, 50 Hz, 60 Hz, etc.) and/or DC power (e.g., 12 VDC, 24 VDC, battery charging power, etc.). The auxiliary power conversion circuitry 126 outputs one or more AC power outputs (e.g., AC outlets or receptacles) and/or one or more DC power outputs (e.g., DC outlets or receptacle). The power system 100 enables multiple ones of the power subsystems (e.g., the hydraulic pump, the air compressor 122, the welding-type conversion circuitry 120, the auxiliary power conversion circuitry 126, the external power supply subsystem 128, etc.) to be operated simultaneously.

In some examples, the power system 100 includes a user interface 130. The user interface 130 includes an input device configured to receive inputs selecting mode(s) representative of welding-type processes, mode(s) representative of one or more battery charging modes, mode(s) representative of a vehicle load, and/or other modes such as a pneumatic load and/or a hydraulic load. In the example of FIG. 2, the user interface 130 is located on the front panel 108 of the enclosure 102.

The power system 100 further includes one or more fan(s) 134. The fan(s) 134 may be integral or attached to the engine 114 and/or the generator 116, and/or may be separate components within the enclosure 102. The fan(s) 134 generate one or more airflows 136 through the enclosure 102 to cool some or all of the components 114, 116, 120-126, 132 within the enclosure 102, to provide air to the engine 114 for combustion, and/or to supply air to an intake of the compressor 122.

To direct the airflow 136, the example enclosure 102 further includes a baffle 138. The example baffle 138 is structured and positioned such that the baffle separates a first volume 140 of the enclosure 102 from a second volume 142 of the enclosure 102. The engine 114 and the generator 116 are located in the second volume 142, and the baffle 138 directs the airflow 136 between the first volume 140 and the second volume 142 through an aperture 144 in the baffle 138. The baffle 138 is adjacent the engine 114, and the aperture 144 of the illustrated example aligns with the intake fan 134 of the engine 114.

To support the components 114, 116, 120-126, 132 within the enclosure 102, the example enclosure 102 includes a base 146, an upper portion 148 above the base 146, and a support rail 150 positioned between the base 146 and the upper portion 148 (illustrated in FIG. 1). The support rail 150 may be present on one, two, three, or all sides of the enclosure 102, and provides structural support to the engine 114, the generator 116, and/or any other components 120-126, 132 which may benefit from lateral support within the enclosure 102.

In the example of FIGS. 1 and 2, the panels of the enclosure 102 at the base 146 are not easily removable (e.g., apart from partial or complete disassembly of the enclosure 102). Conversely, some or all of the panels in the upper portion 148 may be more easily removable (e.g., via latches, clips, hinges, fasteners, and/or any other methods of attachment) to provide access to the interior of the enclosure 102.

Figures 3A, 3B:
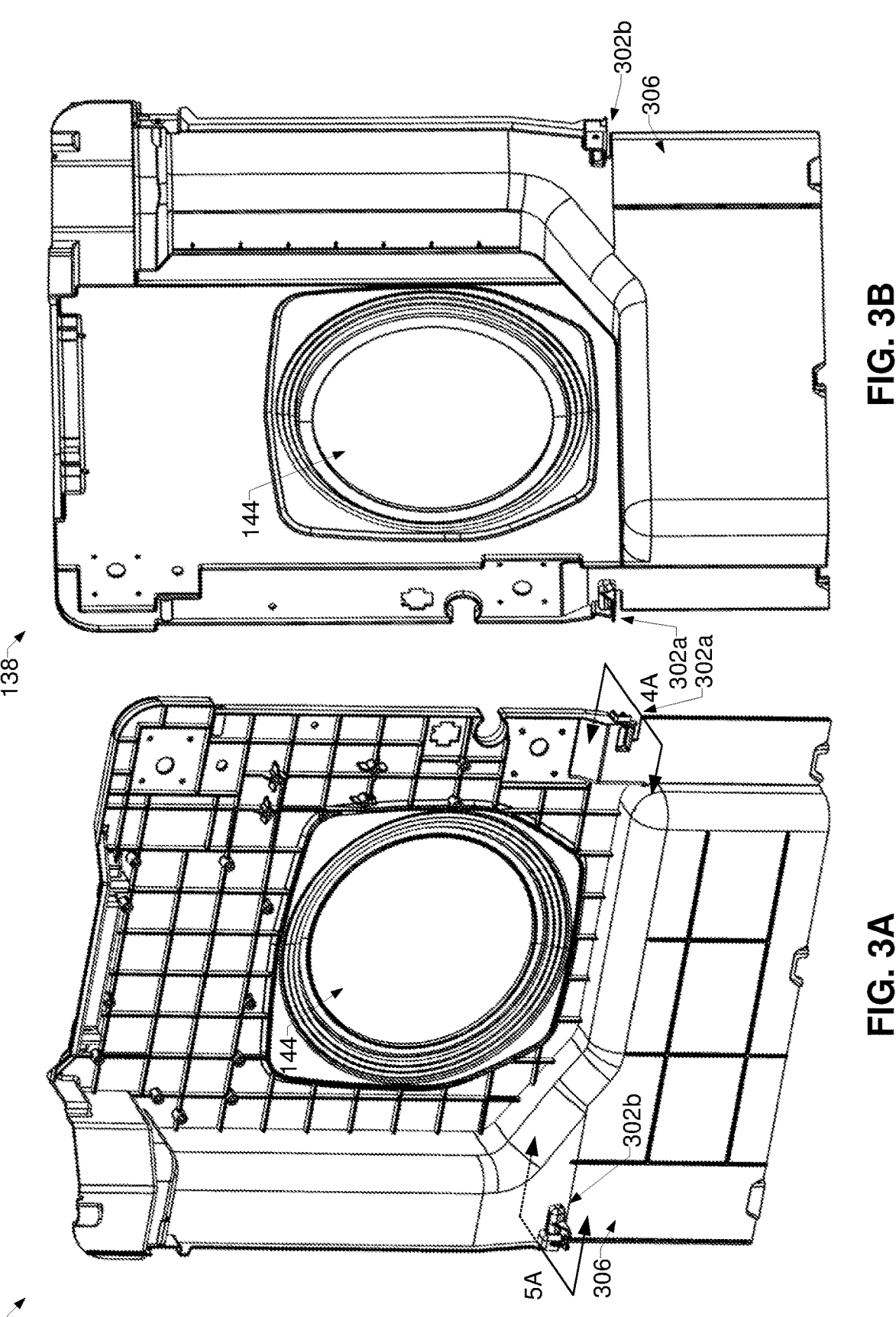
FIGS. 3A and 3B are perspective views, from opposing sides, of an example implementation of the baffle of FIG. 2.

FIGS. 3A and 3B are perspective views, from opposing sides, of an example implementation of the baffle 138 of FIG. 2. The example baffle 138 has a height and width to substantially match the cross-section (e.g., height and width) of the enclosure 102 of FIG. 2. In contrast with conventional baffles having a similar airflow-directing and enclosure division configuration, the baffle 138 can be installed and/or removed from multiple directions in the enclosure 102, including when other components are present in the enclosure 102. To this end, the example baffle 138 is configured to be attached to the enclosure, support structure, and/or internal components of the system 100 at locations which are easily accessible to an operator (e.g., in the upper portion 148 of the enclosure 102). Additionally, the baffle 138 is not attached to the enclosure 102 or support structure (e.g., the support rail 150) at locations below the support rail 150, where access is limited. In this manner, the baffle 138 is removable from the enclosure 102 and installable into the enclosure 102 via access to the baffle 138 via the upper portion of the enclosure 102.

While the baffle 138 is removable and installable via access via an interior of the upper part of the enclosure 102, access to the interior of the enclosure includes access to any location on the exterior of the enclosure 102. Access to locations on the exterior is typically far less restrictive than access within the interior of the enclosure 102, and does not typically present access challenges. For example, removal and installation of the baffle 138 may involve accessing fasteners attached above the base 146 on an interior of the enclosure 102, and accessing zero or more fasteners on an exterior of the enclosure 102 including an exterior of the base 146.

Figure 4A:
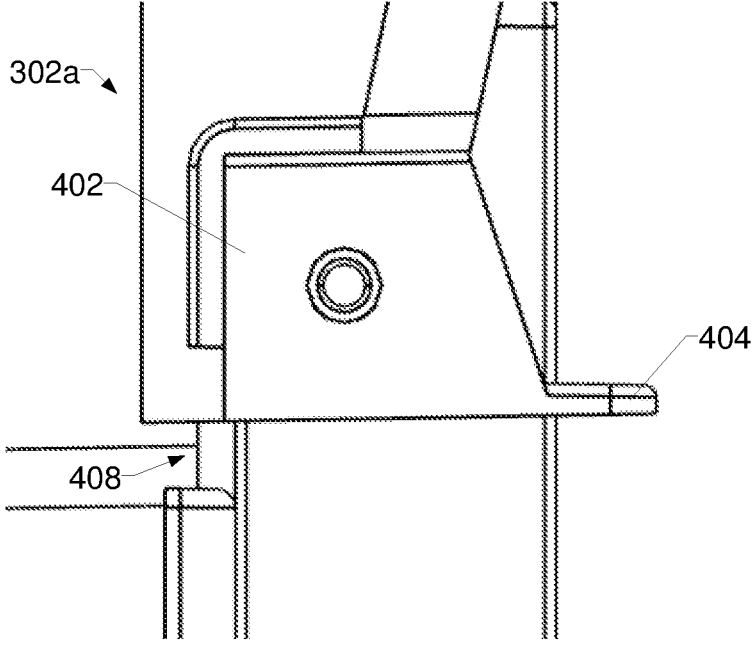
FIG. 4A is a side elevation view of the example fastener attachment.
Figure 4B:
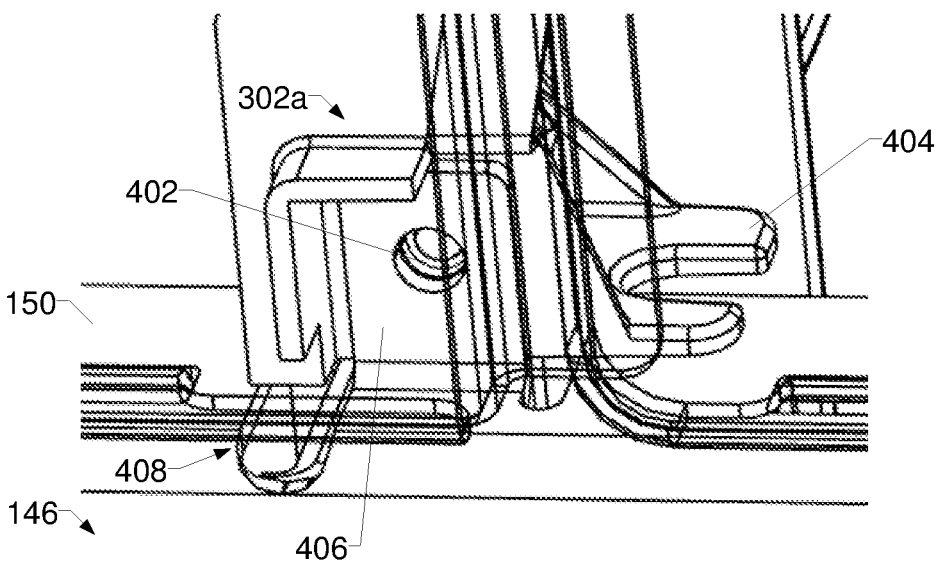
FIG. 4B is a perspective view of the example fastener attachment in an installed position.
Figure 4C:
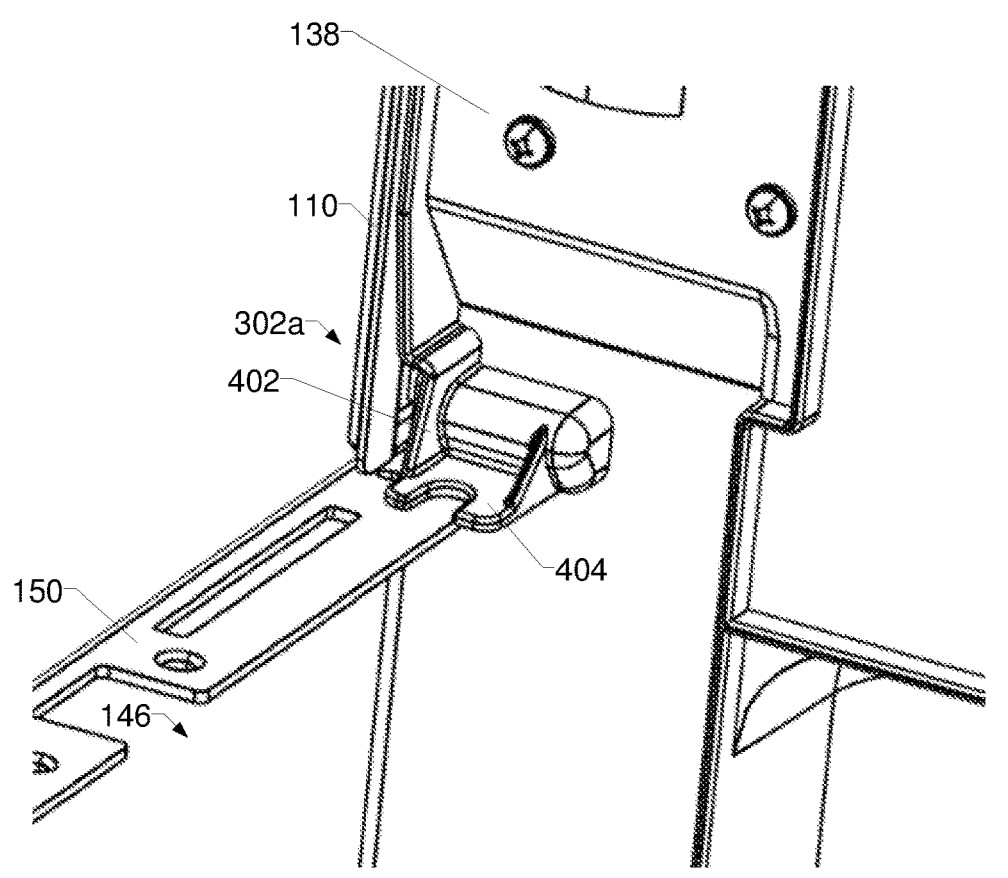
FIG. 4C is another perspective view of the example fastener attachment in the installed position.
Figure 4D:
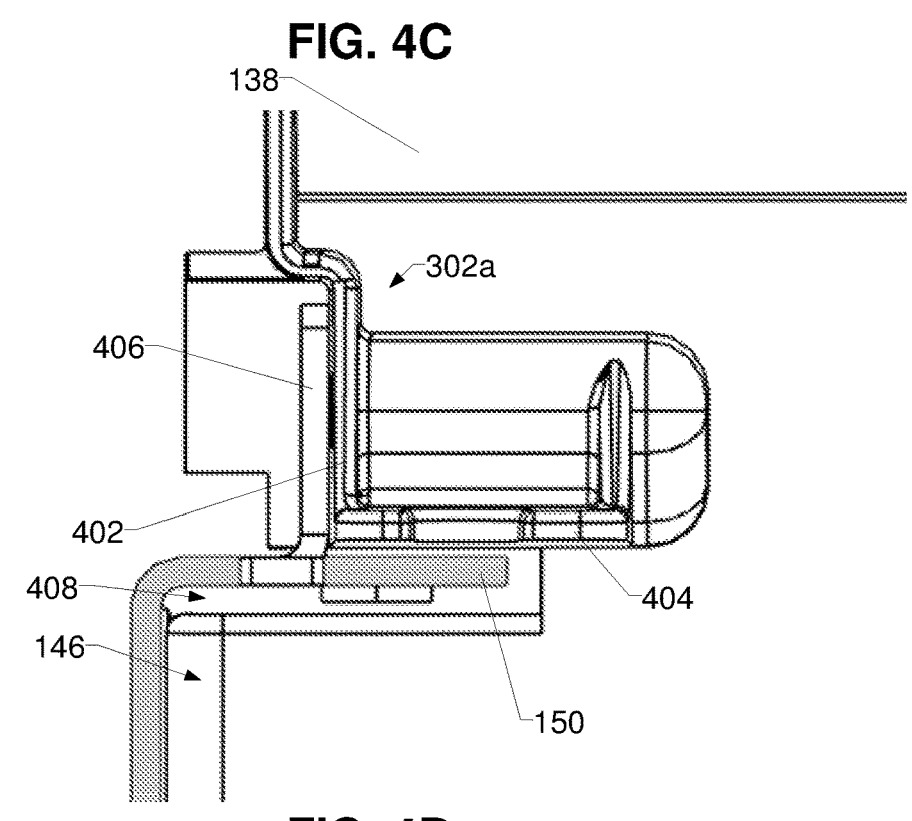
FIG. 4D is a rear elevation view of the example fastener attachment in the installed position.

As illustrated in FIGS. 3A and 3B, the example baffle 138 includes fastener attachments 302a, 302b for attachment to the support rail 150. FIG. 4A is a side elevation view of the example fastener attachment 302a, and FIG. 4B is a perspective view of the example fastener attachment 302a in an installed position. FIG. 4C is another perspective view of the example fastener attachment 302a in the installed position, and FIG. 4D is a rear elevation view of the example fastener attachment 302a in the installed position.

The example fastener attachment 302a includes a vertical fastener attachment 402 and a horizontal fastener attachment 404. As shown in FIG. 4B, the vertical fastener attachment 402 may be a screw hole which receives a screw for attachment to an adjacent tab 406 attached to the enclosure 102 (e.g., attached to the support rail 150 or other support structure). The horizontal fastener attachment 404 may be attached to the support rail 150 using a fastener (e.g., a screw, a clip, etc.) or any other attachment device or technique.

The example fastener attachment 302a further includes a cutout 408 which allows the baffle 138 to fit through and/or under the support rail 150. Additionally or alternatively, the fastener attachment 302a and/or other locations on the baffle 138 may include protrusions to be inserted into corresponding holes in the enclosure 102 to similarly support and limit movement of the baffle 138 in the installed position.

Figure 5A:
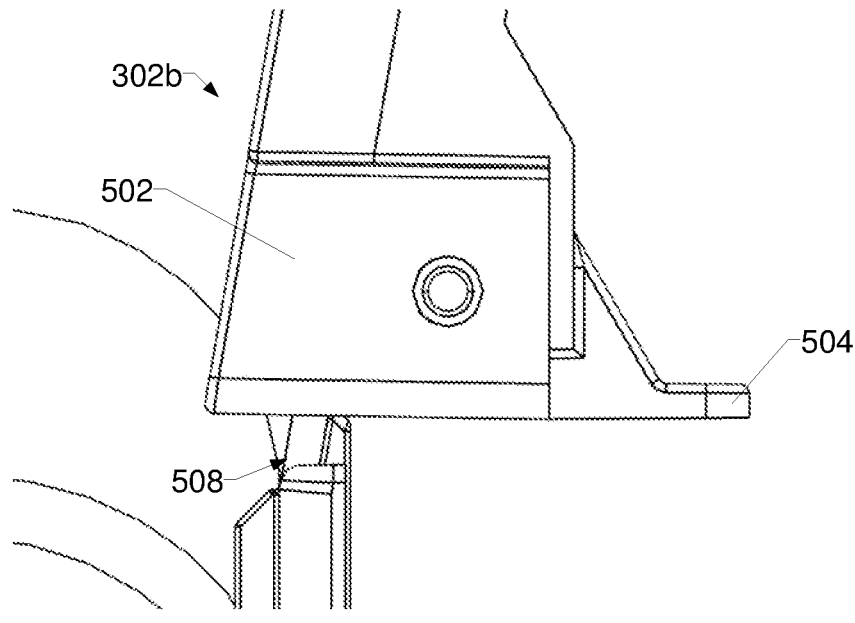
FIG. 5A is a side elevation view of the example fastener attachment.
Figure 5B:
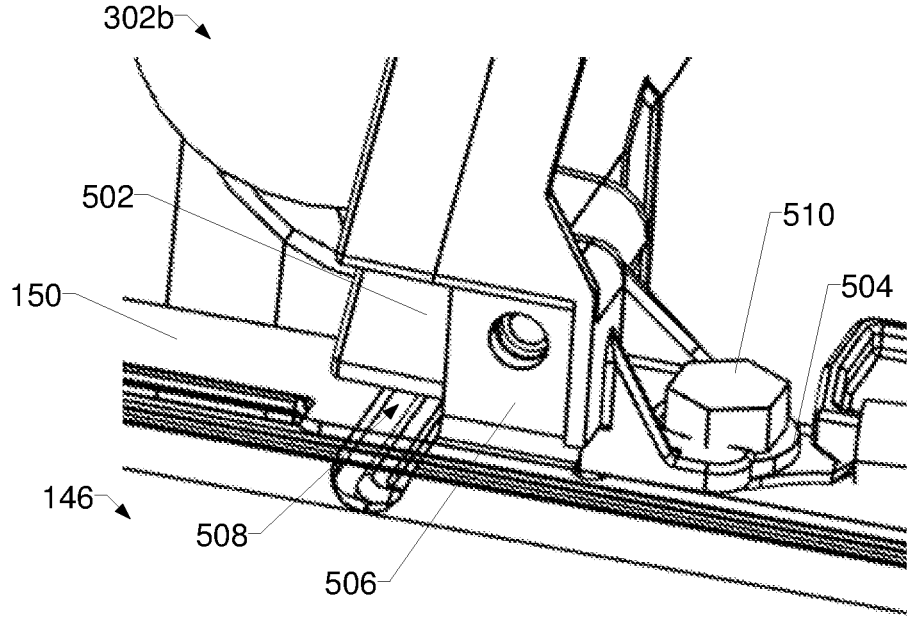
FIG. 5B is a perspective view of the example fastener attachment in an installed position.
Figure 5C:
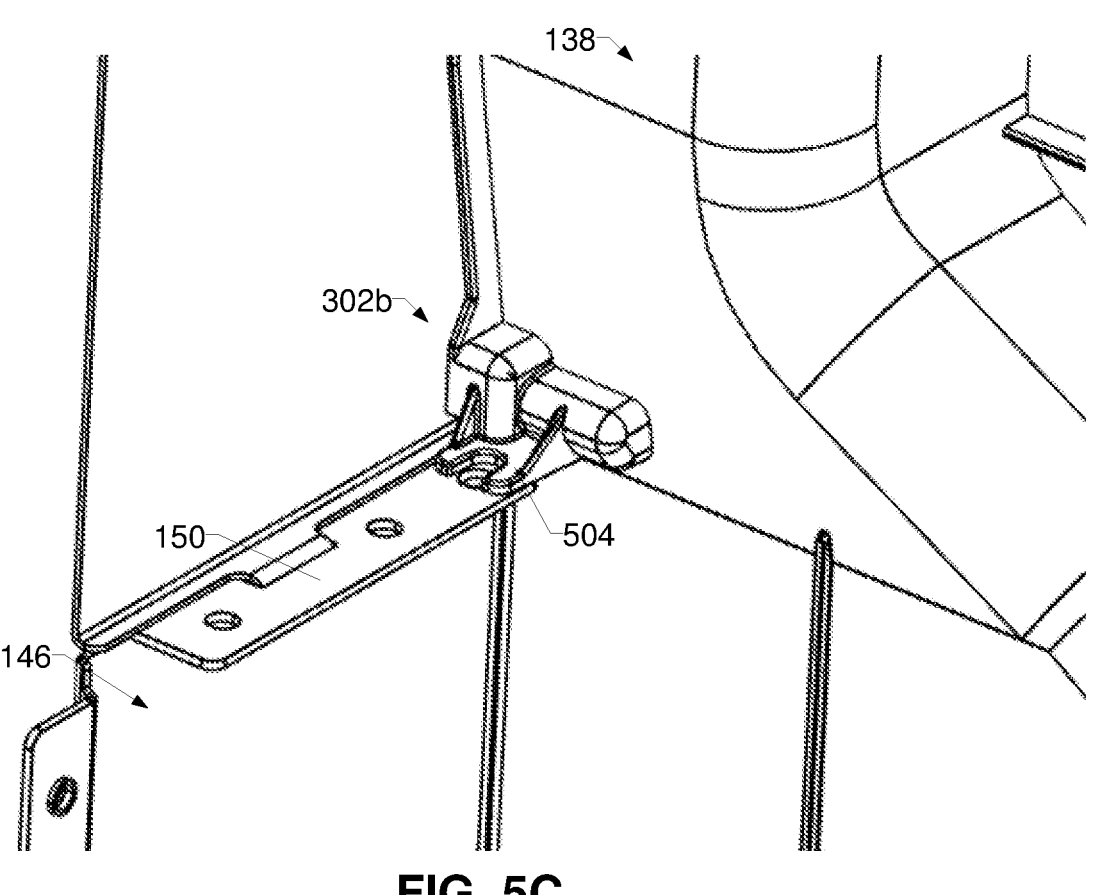
FIG. 5C is another perspective view of the example fastener attachment in the installed position.
Figure 5D:
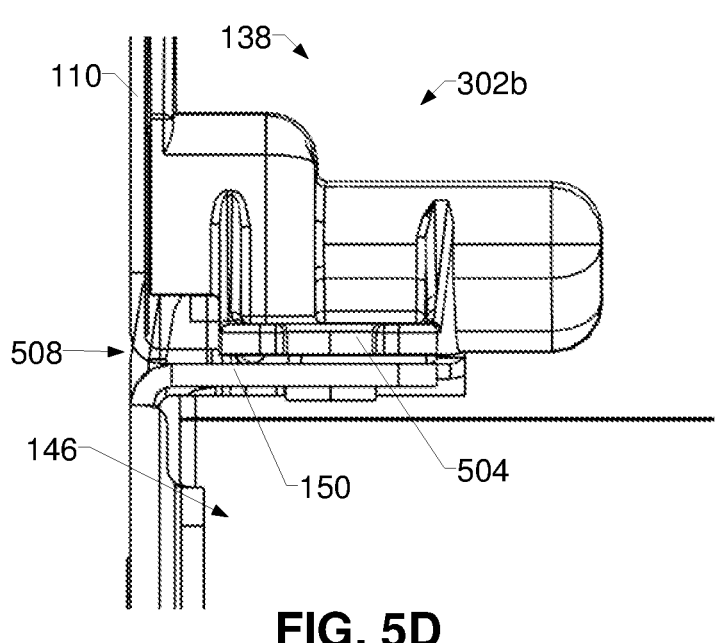
FIG. 5D is a front elevation view of the example fastener attachment in the installed position.

FIG. 5A is a side elevation view of the example fastener attachment 302b, and FIG. 5B is a perspective view of the example fastener attachment 302b in an installed position. The example fastener attachment 302b includes a vertical fastener attachment 502 and a horizontal fastener attachment 504. FIG. 5C is another perspective view of the example fastener attachment 302b in the installed position, and FIG. 5D is a front elevation view of the example fastener attachment 302b in the installed position.

As shown in FIG. 5B, the vertical fastener attachment 502 may be a screw hole which receives a screw for attachment to an adjacent tab 506 attached to the enclosure 102 (e.g., attached to the support rail 150 or other support structure).

The example fastener attachment 302a further includes a cutout 508 which allows the baffle 138 to fit through and/or under the support rail 150. By installing the baffle 138 under the support rail 150, the support rail 150 may provide a further, non-fastener-based, feature to retain the baffle 138 in the installed position. The support rail 150 and/or the base 146 may include cutouts, channels, protrusions, and/or other features to interface with the cutouts 408, 508 and/or with a lower portion 306 of the baffle 138 below the cutouts 408, 508. Additionally or alternatively, the fastener attachments 302a, 302b and/or other locations on the baffle 138 may include protrusions to be inserted into corresponding holes in the enclosure 102, to similarly support and limit movement of the baffle 138 in the installed position.

The vertical fastener attachments 402, 502 may be attached to the respective tabs 406, 506 using any other type of fastener or attachment technique. The horizontal fastener attachment 504 may be attached to the support rail 150 using a fastener 510 (e.g., a screw, a clip, etc.) or any other attachment device or technique.

In the example of FIGS. 4A-5D, the fastener attachments 302a, 302b extend in opposite directions from the baffle 138. For example, the fastener attachment 302a extends toward the rear of the power system 100 and the fastener attachment 302b extends toward the front of the power system 100. However, in other examples the baffle 138 may be configured such that both fastener attachments 302*a*, 302*b* extend in a same direction (e.g., towards the front or rear of the power system 100).

Figure 6A:
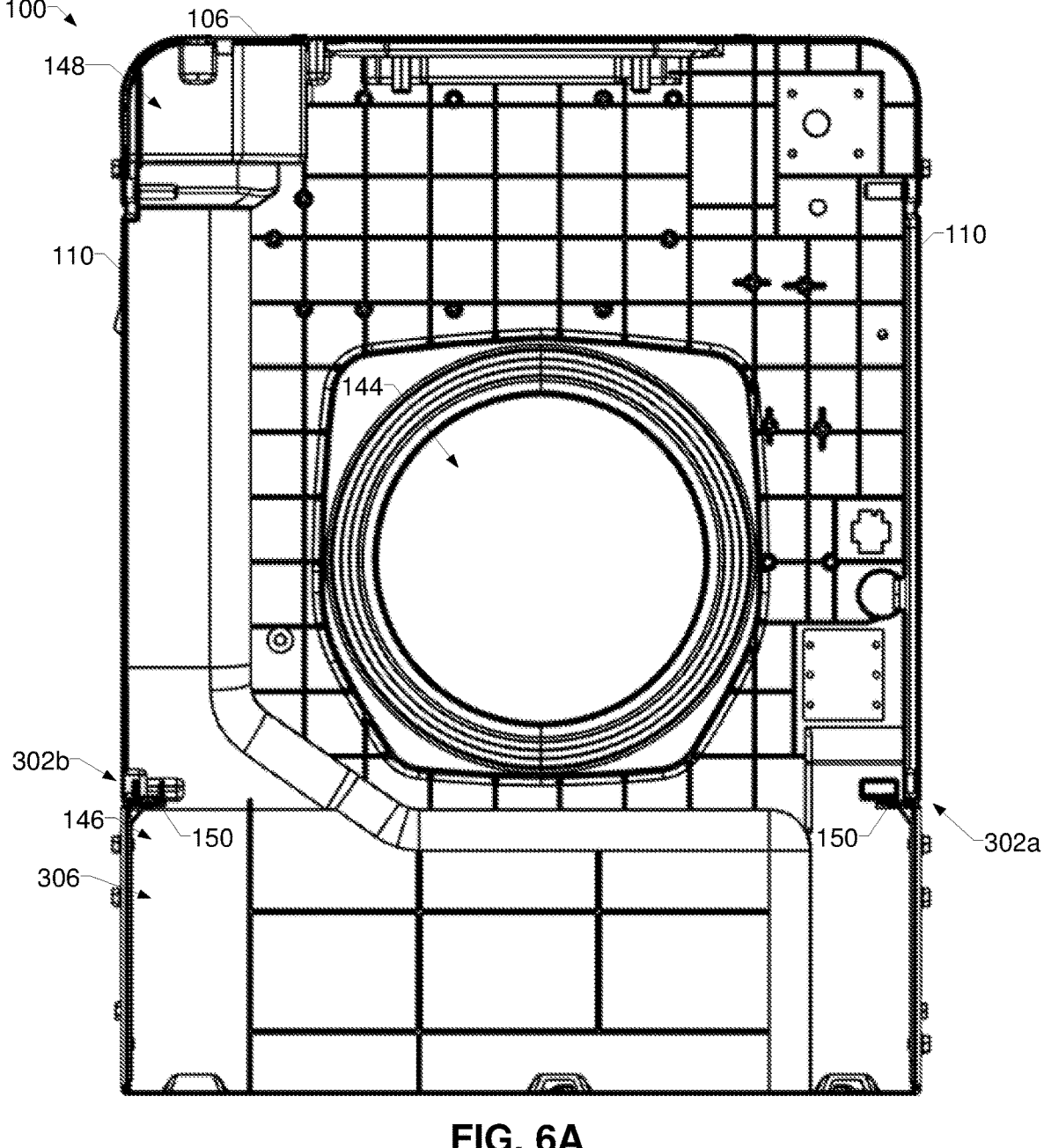
FIG. 6A is a front elevation view of the example baffle installed in the enclosure.
Figure 6B:
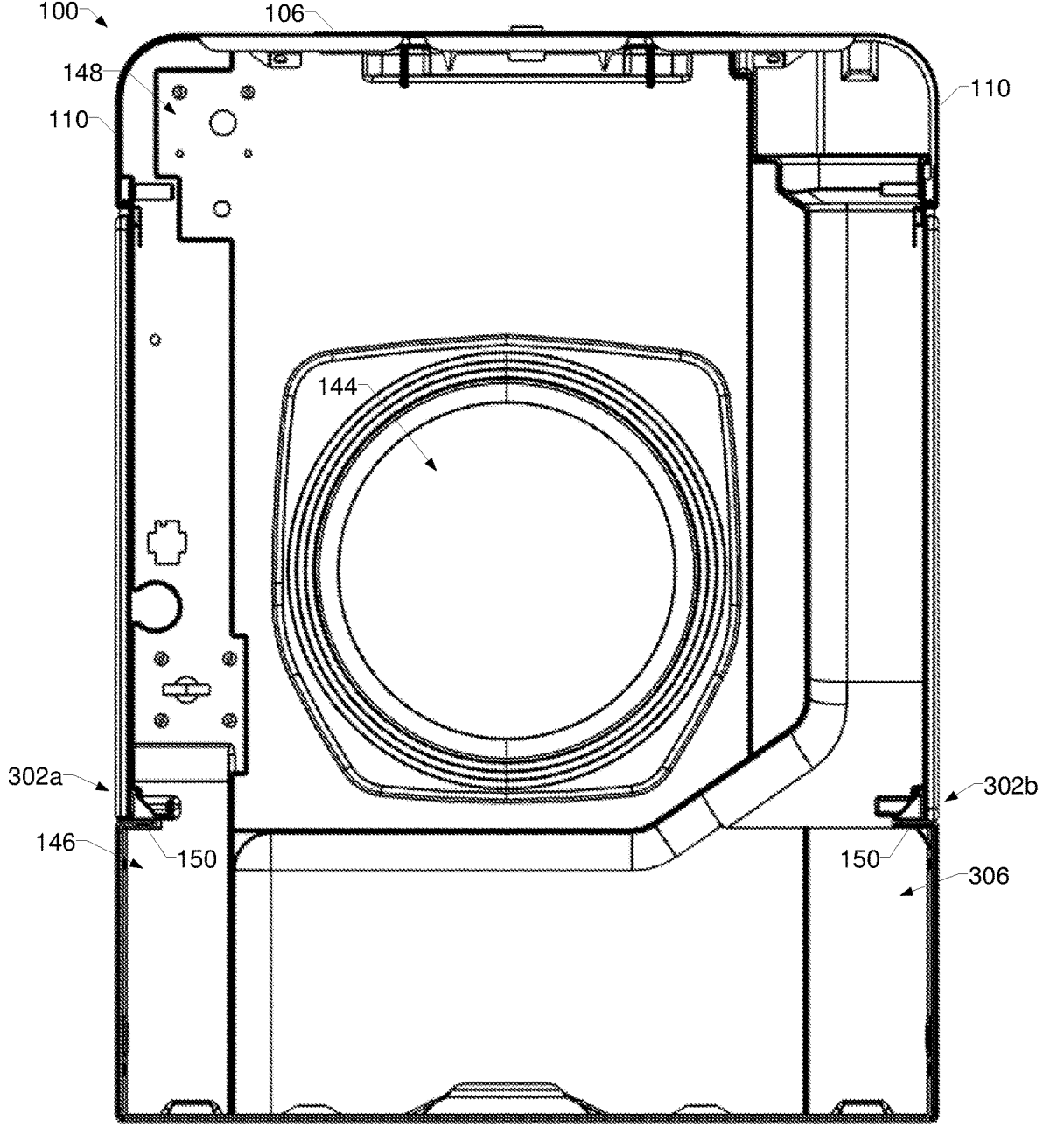
FIG. 6B is a rear elevation view of the example baffle installed in the enclosure.

FIG. 6A is a front elevation view of the example baffle 138 installed in the enclosure 102, and FIG. 6B is a rear elevation view of the example baffle 138 installed in the enclosure 102. Returning to FIG. 3A, the baffle 138 is installable and removable through at least the front panel 108 and the top panel 106. Removal through the front panel 108 may require removal of the front panel 108 and any components blocking such removal.

The example baffle 138 is also configured to enable removal of the baffle 138 through the top panel 106 without removal of additional components (other than attachment hardware for the baffle 138). For example, the baffle 138 may be formed to pass around, or avoid interference with, adjacent interior components of the enclosure 102 when being installed through the top of the enclosure 102 (e.g., with the top panel 106 opened or removed, etc.).

While directing the airflow 136 to the desired flow path (e.g., through the engine 114) and blocking or restricting other airflows, the baffle 138 may include one or more apertures, channels, and/or passthroughs to enable routing of cables or other components between the first and second volumes 140, 142. The apertures, channels, and/or pass-throughs may be formed to limit airflow leakage across the baffle 138 between the volumes 140, 142 to avoid affecting the airflow 136.

The example baffle 138 of FIGS. 3-6B is a single molded or formed piece. In other examples the baffle may be constructed or assembled using multiple pieces. For example, a portion of the baffle (e.g., a portion similar to the lower portion 306 of FIG. 3) may be positioned below the support rail 150 and installed in a substantially permanent manner (e.g., not intended for removal). An upper portion of the baffle (or upper baffle) may then be attachable and easily removable via the top panel 106 and/or the front panel 108 in a similar, or easier, manner as the baffle 138 of FIGS. 3-6B. The upper baffle may be attached to the lower baffle and/or the enclosure 102 (e.g., the support rail 150) for installation.

While the example baffles disclosed herein have example geometries, apertures, installation locations, and attachment features, any of the geometries, apertures, installation locations, and attachment features may be modified based on the presence and arrangement of components within the enclosure, the accessibility provided by the enclosure, the airflow needs of the power system, and/or any other considerations.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to per-form the function, regardless of whether performance of the function is disabled or not enabled (e.g., by a user-config-urable setting, factory trim, etc.).

While the present method and/or system has been described with reference to certain implementations, it will be understood by those skilled in the art that various changes may be made and equivalents may be substituted without departing from the scope of the present disclosure. In addition, many modifications may be made to adapt a particular situation or material to the teachings of the present disclosure without departing from its scope. For example, systems, blocks, and/or other components of disclosed examples may be combined, divided, re-arranged, and/or otherwise modified. Therefore, the present method and/or system are not limited to the particular implementations disclosed. Instead, the present method and/or system will include all implementations falling within the scope of the appended claims, both literally and under the doctrine of equivalents.

What is claimed is:

1. A power system comprising:
an enclosure comprising a base and an upper portion above the base, and the enclosure having at least a first volume and a second volume within the enclosure;
an engine within the second volume of the enclosure;
a generator within the second volume of the enclosure and configured to convert mechanical power from the engine to electrical power; and
a baffle located within the enclosure and between the first volume and the second volume of the enclosure, and extending into both the base and the upper portion of the enclosure, the baffle configured to direct airflow between the first volume and the second volume through an aperture, and the baffle being attached to the enclosure above the base, and the baffle being not attached to the enclosure within the base, such that the baffle is removable from the enclosure and installable into the enclosure via access to the baffle via the upper portion of the enclosure, wherein the baffle is a single molded or formed piece.

2. The power system as defined in claim 1, wherein the enclosure further comprises a support rail positioned between the base and the upper portion.

3. The power system as defined in claim 2, wherein the baffle is configured to be attached to the enclosure via the support rail.

4. The power system as defined in claim 2, wherein the baffle is not attached to the enclosure below the support rail.

5. The power system as defined in claim 1, wherein the enclosure comprises a front panel located on a front of the enclosure, the front panel having at least one of a user interface or a welding output terminal, wherein the baffle is removable through the front of the enclosure when the front panel has been removed.

6. The power system as defined in claim 1, wherein the baffle is removable through a top of the enclosure.

7. The power system as defined in claim 6, wherein the enclosure comprises a top panel, and the baffle is removable through the top panel.

8. The power system as defined in claim 7, wherein the baffle is removable through the top panel without requiring removal of other components.

9. The power system as defined in claim 1, wherein the aperture aligns with an intake fan of the engine.

10. The power system as defined in claim 1, wherein the baffle is adjacent the engine.

11. The power system as defined in claim 1, further comprising, within the enclosure, one or more of:

welding-type conversion circuitry configured to convert the electrical power from the generator to welding-type power;

an air compressor coupled to at least one of the electrical power from the generator or the mechanical power from the engine and configured to output compressed air;

a hydraulic pump configured to generate hydraulic pressure from at least one of the electrical power from the generator or the mechanical power from the engine; or auxiliary power conversion circuitry configured to convert the electrical power from the generator to at least one of AC output power or DC output power.

12. The power system of claim 11, wherein the base is configured to support one or more of the engine, the generator, the welding-type conversion circuitry, the air compressor, the hydraulic pump, or the auxiliary power conversion circuitry.

13. The power system as defined in claim 1, wherein the baffle comprises protrusions to be attached to the enclosure via inserting the protrusions into holes in the enclosure.

14. A power system comprising:

an enclosure comprising a base, an upper portion above the base, and a support rail positioned between the base and the upper portion, and the enclosure having at least a first volume and a second volume within the enclosure, the support rail extending from the first volume to the second volume;

an engine within the second volume of the enclosure;

a generator within the second volume of the enclosure and configured to convert mechanical power from the engine to electrical power; and a baffle located within the enclosure and between the first volume and the second volume of the enclosure, the baffle configured to direct airflow between the first volume and the second volume through an aperture, and the baffle being attached to the enclosure via the support rail and the baffle being not attached to the enclosure below the support rail, such that an entirety of the baffle is removable from the enclosure and installable into the enclosure via access to the baffle via the upper portion of the enclosure.

15. The power system as defined in claim 14, wherein the baffle is removable through a top of the enclosure.

16. The power system as defined in claim 15, wherein the enclosure comprises a top panel, and the baffle is removable through the top panel.

17. The power system as defined in claim 16, wherein the baffle is removable through the top panel without requiring removal of other components.

* * * * *